United States Patent [19]

Ahmed

[11] 4,051,391
[45] Sept. 27, 1977

[54] CURRENT-OPERATED CIRCUITS AND STRUCTURES

[75] Inventor: Adel Abdel Aziz Ahmed, Annandale, N.J.

[73] Assignee: RCA Corporation, New York, N.Y.

[21] Appl. No.: 463,606

[22] Filed: Apr. 24, 1974

[51] Int. Cl.² .................... H03K 1/12; H01L 27/02
[52] U.S. Cl. .................... 307/297; 307/218; 307/303; 357/46; 357/51; 179/18 FG; 323/9
[58] Field of Search ........... 307/213, 215, 218, 303, 307/310, 237, 297; 357/41, 46; 179/18 FG; 323/9

[56] References Cited

U.S. PATENT DOCUMENTS

| | | | |
|---|---|---|---|
| 3,416,043 | 12/1968 | Jorgensen | 307/218 |
| 3,573,504 | 4/1971 | Breuer | 307/297 |
| 3,755,693 | 8/1973 | Lee | 307/237 |

*Primary Examiner*—Stanley D. Miller, Jr.
*Assistant Examiner*—B. P. Davis

*Attorney, Agent, or Firm*—H. Christoffersen; S. Cohen; A. L. Limberg

[57] ABSTRACT

Current-mode OR gates useful, for example, in telephone cross-point switch systems. A current-mode OR gate withdraws an output current of predetermined level at its output terminal whenever an input current of sufficient level is applied to one or more of its plurality of input terminals. Each input terminal is connected to the base electrode of a transistor, having its collector electrode connected to the output terminal and having its emitter electrode connected by a resistor to a common terminal. Each input current will bias the transistor to which base it is applied, into conduction, to cause its collector current to be withdrawn through the output terminal. The total output current is constrained to the predetermined level by sensing the potential across the resistor and, in response to this potential reaching a predetermined value, clamping each of the input terminals receiving current to prevent further increase of the potential across the resistor.

21 Claims, 10 Drawing Figures

PLAN

SECTION A-A'

SECTION B-B'

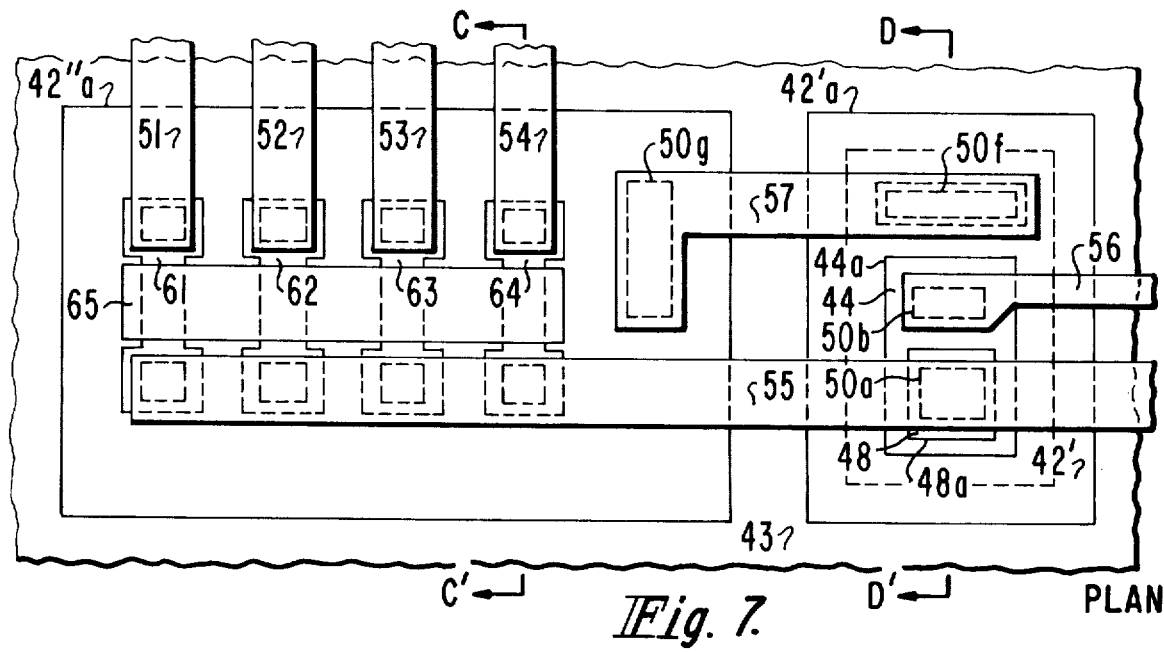
Fig. 7.
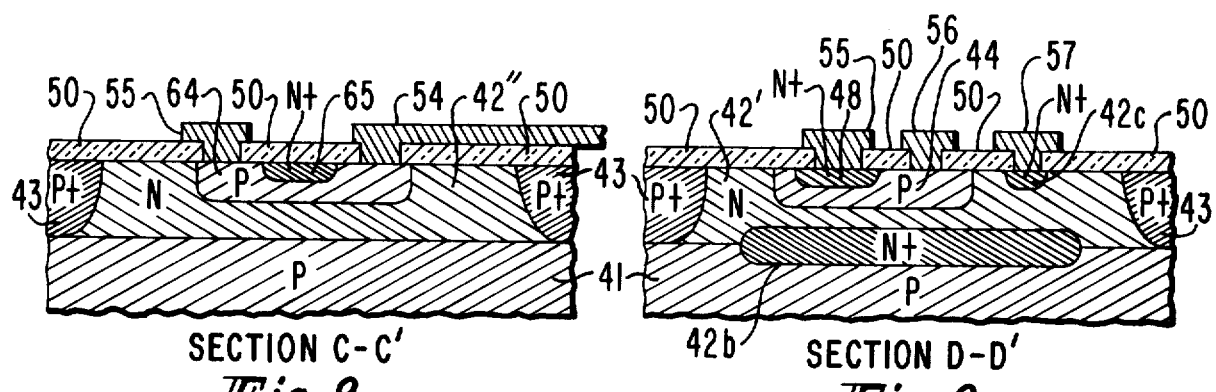
Fig. 8. SECTION C-C'
Fig. 9. SECTION D-D'
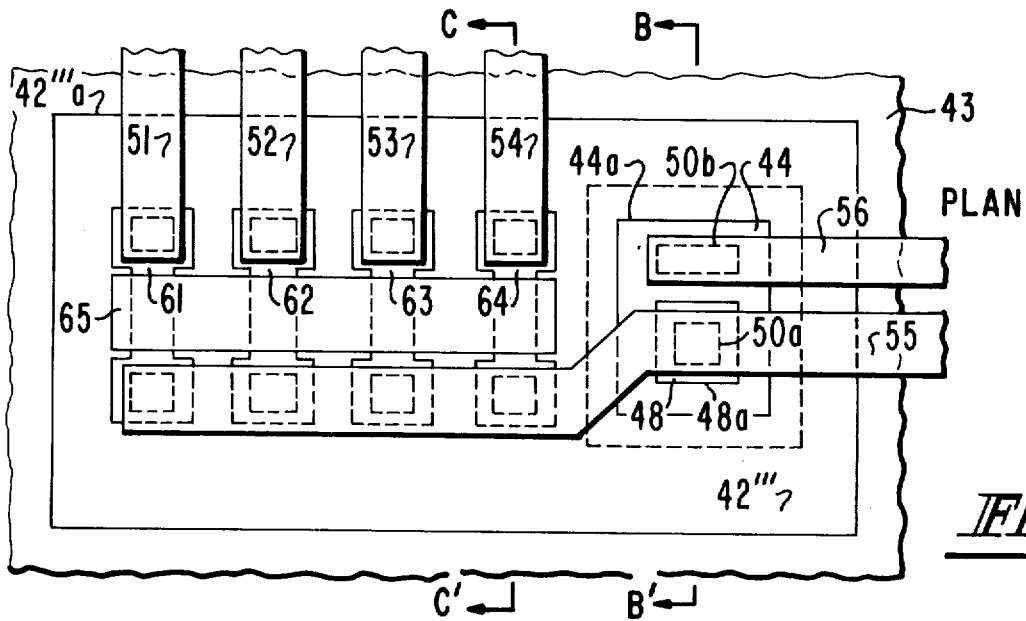
Fig. 10.

CURRENT-OPERATED CIRCUITS AND STRUCTURES

An OR gate is a logic element in which the output signal is in a "high" condition when any of its input signals is in a "high" condition and in which the output signal is in a "low" condition when and only when all of its input signals are in a "low" condition. Often, these "high" and "low" conditions are expressed in terms of the binary numbers ONE and ZERO, respectively. ONE and ZERO are also sometimes referred to as logical "1" and logical "0", respectively. OR gates are well-known in which the "low" and "high" conditions of the input and output signals are each defined in terms of voltage levels. These prior art designs have a shortcoming insofar as their inclusion in a telephone crosspoint system is concerned, in that their current demands tend to vary with operating potential. It is desirable, however, that the total current demands of the crosspoint subsystems in a telephone switchboard or exchange be maintained within fairly tight limits. This is desirable insofar as permitting the use of protection circuits sensitive to over-current conditions indicative of a system fault to forestall extended damage to the system. At the same time, it is highly desirable from the standpoints of economy, reliability and compactness of the equipment to be able to dispense with regulation of the operating potentials supplied to the various portions of the system.

The operating potentials in a telephone switchboard or exchange are subject to variation. Since the operating currents required from the power supplies can not be completely determined, this will cause variation of the operating potentials provided by less than well-regulated power supplies. A-c power from the power line company mains is transformed in voltage, rectified and filtered to provide operating potentials under normal conditions of operation. Standby batteries are used to provide operating potentials under emergency conditions when mains power delivery is disrupted. As the stand-by batteries are discharged, the operating potentials which they supply decay. In cases where these stand-by batteries are not floated across the normal operating supply to provide regulation at the same time they are kept under continuous charge, there tends to be a change in supplied operating potential when the stand-by batteries are called into use. These circumstances make it desirable to use current-mode rather than voltage-mode OR gates in telephone circuitry.

Another important reason for using current-mode OR gates arises when their input signals are obtained from sensing the state of semiconductor controlled rectifiers (SCR's) used as cross-point switches. Since the SCR's are held in conduction by current supplied via the signal lines and the signal lines should be loaded as little as necessary, practically it is necessary to used high-impedance sensing means. The high source impedance presented to the OR gate by the sensing means makes current mode logic more practicable than voltage-mode logic.

A current-mode OR gate has its "low" or ZERO and "high" or ONE signal states defined in terms of current levels rather than voltage levels. In the present inventor's previous designs of integrated-circuit cross-point subsystems, the current-mode OR function is accomplished by the simple expedient of merely summing the input currents to form the output current. However, this expedient is satisfactory only as long as the sum of the maximum input current levels identified as ZERO's is substantially smaller than the minimum output current level recognized as a ONE.

Also, this prior art technique of simply summing input currents to perform the OR gate function is handicapped by the fact that the output current may become excessively large when many of the input currents are in their "high" state. That is, the output current is $n$ times as large as it needs to be to establish its "high" state where it is recognized as a ONE, $n$ being the number of input currents. When many OR gates are required in a system, this excessively large output current causes a needless drain on the operating power supplies.

A primary aspect of the present invention is the provision of a current-mode OR gate which has a separate threshold detection circuit for determining whether each of the input currents to the OR gate is in its "high" or its "low" state. This permits the gate to better distinguish when only one of its input signals is a ONE from a condition in which all its input sinals are ZERO but their sum can be as large as the single input ONE current— as, for example, becuase of noise and leakage currents accompanying the input currents. The current-mode OR gate also includes means for regulating its output current to a uniform ONE level, whether in response to one or to more of its input signals being a ONE.

Other aspects of the present invention concern integrated-circuit devices suited to carrying out the construction of such a current-mode OR gate. Of particular interest is the concept of dynamically biasing an isolation boat to obtain additional functions from the components disposed therein, as contrasted with the conventional practice of biasing the isolation boat at fixed potential. The dynamic isolation boat biasing technique is used for fabricating a diode steering network in minimum integrated circuit area.

Figure 6:
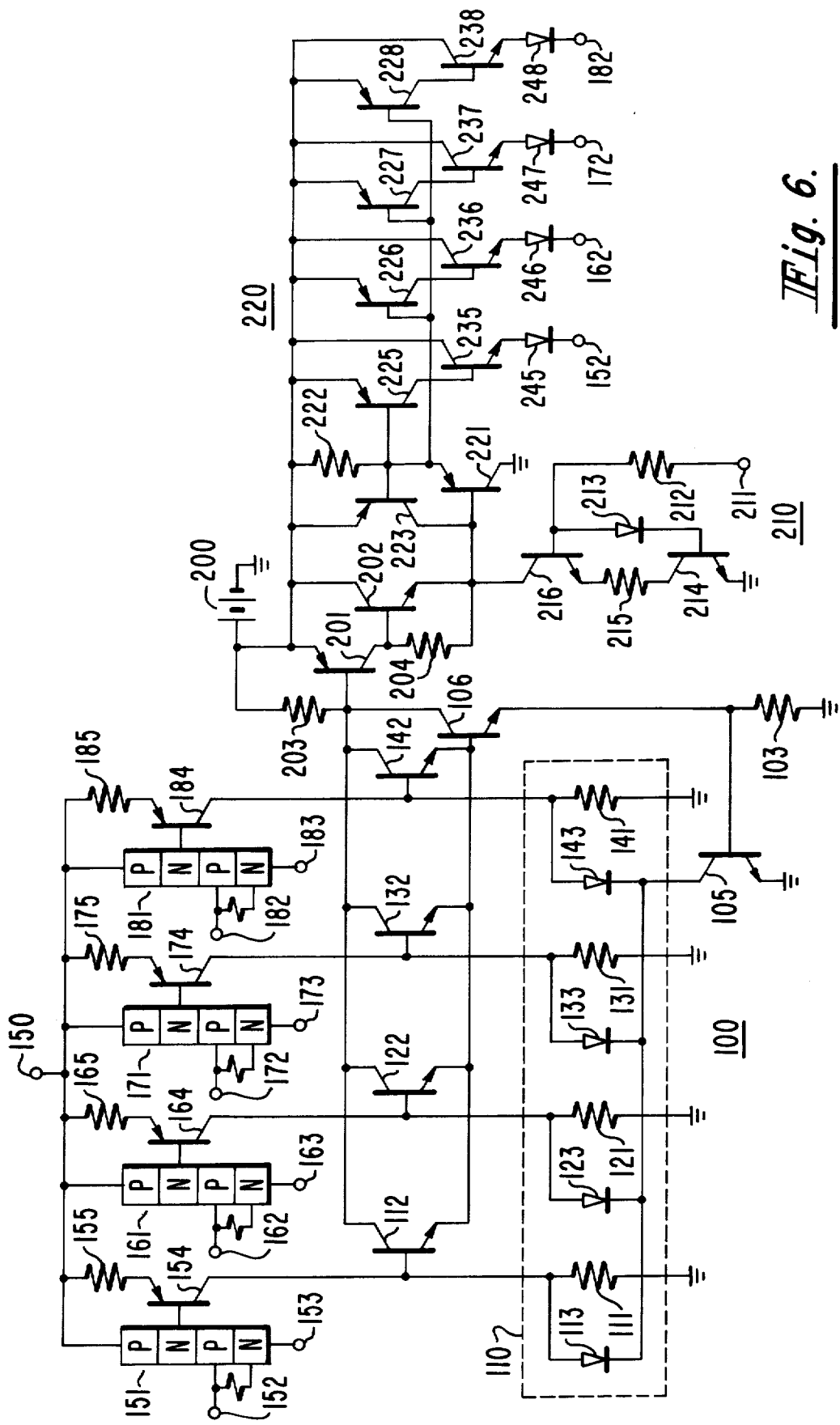
FIG. 6 is a schematic diagram of a portion of a cross-point switch including a current-mode OR gate embodying the present invention.

FIGS. 7, 8 and 9 are a plan view and first and second cross-sectional views, respectively, of a portion of an integrated circuit realization of the current-mode OR gate of FIG. 6, embodying a further aspect of the present invention; and FIG. 10 is a plan view of an integrated circuit device which is an alternative realization to that shown in FIG. 7 and embodies a still further aspect of the present invention.

Figure 1:
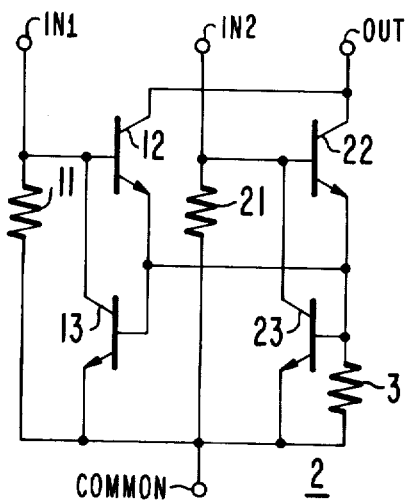
FIGS. 1 and 2 are schematic diagrams of current-mode OR gates embodying the present invention.

FIG. 1 shows a basic form 2 of the currentmode OR gate. Two switched current sources (not shown) connect to the two input terminals 1N1 and 1N2, respectively. Each such source supplies a signal current which is in a "low" or ZERO state in which the current is nominallly zero-valued, or in a "high" or ONE state in which the current has a positive value, or is in transition between the aforementioned states. The source impedance afforded by each of these current sources is at least of the same magnitude as the input impedance presented to it by the OR gate. The terminal COMMON is connected to a point of fixed potential hereafter referred to as ground. The output terminal OUT is connected to a load (not shown) providing a direct current path to an operating potential, which maintains the collector-base junctions of transistors 12 and 22 reverse biased.

Each of the transistors 12 and 22 acts substantially like a switch. The controllably-conductive path between its collector and emitter electrodes is non-conductive when the input terminal connected to its base electrode has a low-valued ZERO current applied thereto and is conductive when that input terminal has a higher-valued ONE current applied thereto.

When nominally zero-valued currents are respectively applied to each of the input terminals IN1 and IN2, they develop insufficient potential drops across resistors 11 and 21, respectively, to forward bias the base-emitter junctions of transistors 12 and 22, respectively. The resistors 11 and 21 hold the respective base potentials of transistors 12 and 22 at ground. Resistor 3 holds the emitter electrodes of transistors 11 and 21 at ground. As is well known, a transistor will not conduct unless forward-bias potential greater than a threshold value (about 550 millivolts for silicon) is applied across its base-emitter junction. Since neither transistor 12 nor 22 withdraws collector current from the terminal OUT, the output current will be substantially zero-valued. That is, the output current will be in its "low" or ZERO state.

Also, since the transistors 12 and 22 provide no emitter currents when ZERO input currents are supplied to terminals IN1 and IN2, there is not enough potential drop across resistor 3 to provide sufficient forward-bias potential across the base-emitter junctions of transistors 13 and 23 to bias them into conduction.

If input current to terminal IN1 is "high", sufficient potential drop will appear across resistor 11 to forward bias the base-emitter junction of transistor 12 to cause collector-to-emitter current flow therethrough. The collector current of transistor 12 in response to the "high" current applied to terminal IN1 would, were transistor 13 non-conductive, exceed the level required to establish the output current in its "high" state. And, were transistor 23 non-conductive, the application of an input current in its high state in input terminal IN2 would cause the collector current of transistor 22 to be added to the output current. (The collector current of transistor 22 responds to a "high" input current applied to terminal IN2 in a completely analogous way to the collector current of transistor 12 responding to a "high" input current applied to terminal IN1.)

The amplitude of the output current in its "high" state is constrained to a predetermined level, however, no matter how many of the input currents are ONE's. This is done in the following manner. Since each of the collector currents of transistors 12 and 22 is related by a factor α (which for normal transistors exceeds 0.97 or so) to its emitter current, their combined collector currents are related by the same factor to their combined emitter currents. The combined emitter currents of transistors 12 and 22 cause a potential drop across resistor 3. If this drop exceed the 0.6 volt base-emitter voltage required to bias transistors 13 and 23 into substantial conduction, portions of the input currents respectively applied to the input terminals IN1 and IN2 are diverted through the collector-to-emitter paths of transistors 13 and 23, respectively, away from the respective base electrodes of transistors 12 and 22. That is, transistors 13 snd 23 together provide shunt regulation of the potential drop across resistor 3. Constraining the potential across resistor 3 to a maximum value, according to Ohm's Law, determines the maximum current flow therethrough and so constrains the combined emitter currents of transistors 12 and 22. In this way, the combined emitter currents and thus the combined collector currents of transistors 12 and 22 are held at predetermined levels so long as at least one of the input currents is a ONE.

If one of the currents supplied to the input terminals IN1 or IN2 is "low" while the other is "high", the transistor 13 or 23 connected to the "high" input terminal will assume the entire shunt regulation operation. The collector electrode of the other transistor is at ground potential, so that that transistor is in saturation and its collector-to-base junction is forward-biased. Accordingly, resistors 11 and 21 should be chosen to have resistances about an order of magnitude larger than the resistance of resistor 3 to avoid shunting resistor 3 appreciably when transistor 13 or 23 is saturated. It may also be desirable to provide a decoupling resistor from the joined emitter electrodes of transistors 12 and 22, to each of the base electrodes of transistors 13 and 23 to reduce shunting of resistor 3 when either of the shunt regulator transistors 13 and 23 is saturated.

However, in the FIG. 1 circuit, the shunting of resistor 3 by saturated shunt regulator transistors can cause the "high" output current of OR gate 2 slightly to vary depending on the number of ONe's applied to its input terminals IN1 and IN2. This effect will be more evident in OR gates of this type having a larger number of input terminals. Such a gate is provided by replicating the configuration comprising IN1, resistor 11, and transistors 12 and 13 not just once with the configuration comprising IN2, resistor 21, transistor 22, and transistor 23, but more than once.

Figure 2:
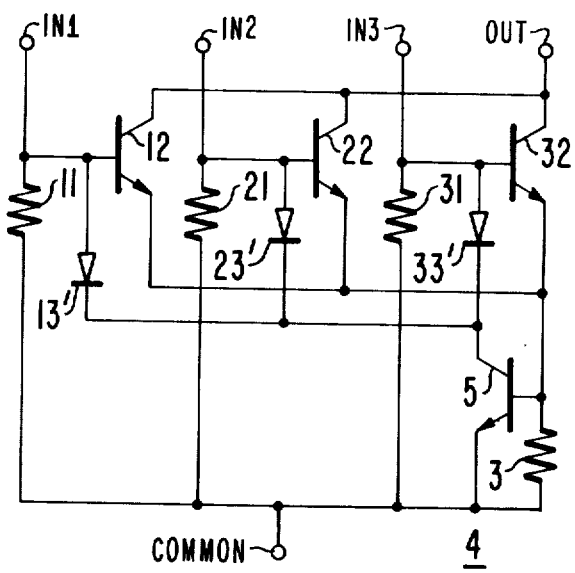

FIG. 2 shows more sophisticated form 4 of a current-mode OR gate in which the above-mentioned problem of saturation of the shunt regulator transistor connected to an input terminal not supplied with a "high" input current is obviated. A single shunt regulator transistor 5 together with a steering network comprising diodes 13', 23' and 33' provides a degenerative feedback connection for maintaining the potential appearing across resistor 3 only a little larger than the threshold potential required to bias its base-emitter junction into conduction.

The potential across resistor 3 attempts to rise above this threshold potential, whenever one or more ONE's are applied to the input terminals IN1, IN2, IN3 of OR gate 4, in response to the combined emitter currents of transistors 12, 22 and 32. This biases transistor 5 into conduction and causes it to present a demand for collector current. This demand is satisfied through the one or ones of diodes 13', 23' and 33 connected to the one or ones of the input terminals IN1, IN2 and IN3 which is relatively high in potential. The one or ones of the input terminals IN1, IN2 and IN3 which will be relatively high in potential are those to which a ONE is applied. An input current in its "high" state will cause the potential drop across resistor 11, 21 or 31, whichever is connected to that input terminal, to be larger than the potential drop across any of these resistors connected to an input terminal only receiving a "low" state of input current.

In some systems (such as the cross-point subsystem described later in this specification) the current levels supplied as ONE's to the various input terminals IN1, IN2 and IN3 may differ considerably from each other. OR gate 4 accomodates these differences by the various ones of the diodes 13', 23' 33' connected to a "high" input terminal adjusting their relative conductances so that the amounts of input current diverted from flowing to the base electrodes of transistors 12, 22 and 32, respectively, are related in substantially the same proportions as the input currents supplied to IN1, IN2 and IN3, respectively. The proportions differ only because of the slight amounts of current flowing through resistors 11, 21 and 31. This comes about because of the exponential current versus voltage characteristics of diodes 13', 23', 33' and of the base-emitter junctions of transistors 12, 22 and 32. All these junctions double their current flow for about a 26 millivolt increase in junction potential. All of the diodes 13', 23' and 33' have their cathodes connected in common and all of the transistors 12, 22 and 32 have their emitter electrodes connected in common. This forces the increase in the emitter-to-base potential of one of the transistors 12, 22, 32 due to increased input current to its respective input terminal IN1, IN2 or IN3 to be accompanied by a corresponding increase in the cathode-to-anode potential of its respective associated diode 13', 23' or 33'. For example, if input current supplied to IN1 is twice as large as that supplied to IN2, the potential at IN1 will be about 26 millivolts higher than that at IN2. This permits base current flow to transistor 12 to be twice as large as the base current of transistor 22 and permits current flow through diode 13' to be twice as large as the current flow through diode 23'. The diodes 13', 23', 33' operate as a steering means to direct from which of the input terminals the collector current demands of the regulator transistor 5 are to be satisfied and in what proportions the input currents are to supply collector current to transistor 5.

Ones of the diodes 13', 23' and 33' which are connected to an input terminal receiving a ZERO will not be conductive. If all the input terminals IN1, IN2 and IN3 have ZERO's applied to them, none of the diodes 13', 23' and 33' will be conductive. Under this latter condition, non of the transistors 12, 22, 32 will have its base-emitter junction forward-biased. Resistor 3 will hold the base electrode of transistor 5 to ground potential preventing forward-bias of its base-emitter junction. Transistor 5 will experience no collector current flow and so presents a relatively high collector impedance. That is to say, transistor 5 is not saturated for this condition.

Transistor 5 is not permitted to saturate during times when one or more of the input terminals is supplied a ONE, either. This is achieved by making the transistor 5 large enough that its collector resistance is too low to have an appreciable potential drop thereacross at a current level equal to the sum of all the input currents at their maximum "high" levels.

The highest of the potentials appearing on the terminals IN1, IN2 and IN3 must exceed the sum of the base-emitter offset potential required to bias the respective threshold detector transistor 12, 22 or 32 into conduction, and of the base-emitter offset potential required to bias the shunt regulator transistor 5 into conduction, which offset potentials are each of the order of 0.6 volts for a silicon transistor. Also, the offset potential across the one of the diodes 13', 23' and 33' connected to the input terminal with highest potential, and thus forward biased by the collector current of transistor 5, is substantially the same value as the voltage across the base-emitter junction of transistor 5 when it is conductive. So, when transistor 5 is conductive, its collector electrode will be maintained at substantially the same potential (within 0.1 volt or so) as appears at its base electrode. This guarantees that the collector-base junction of transistor 5 will be reverse-biased so long as the drop across its collector resistance does not exceed 0.4 volt or so and consequently that saturation will nor occur.

Both the FIG. 1 and FIG. 2 current-mode OR gates enjoy a feature analogous to that found in certain prior-art voltage mode OR gates. This feature is that "low" input currents applied to the individual terminals IN1, IN2, et seq. are prevented from being coupled through to the terminal OUT each by a separate threshold detection circuit. That is, the input current applied to IN1 has to cause sufficient potential drop across resistor 11 to overcome the threshold potential required to render the base-emitter junction of transistor 12 conductive, before there will be collector current flow to transistor 12 through terminal OUT. Similarly, the input current applied to IN2 (or IN3) has to cause sufficient potential drop across resistor 21 (or 31) to overcome the threshold potential required to render the base-emitter junction of transistor 22 (or 32) conductive, before there will be collector current flow to transistor 22 (or 32) through terminal OUT. There is, then, immunity against combined "low" input currents erroneously causing the output current of the OR gate to appear to be "high".

It should be noted that the FIG. 1 and FIG. 2 current-mode OR gates 2, 4 employ opposite logic conventions insofar as their input and their output currents are concerned. This prevents these current-mode OR gates from being cascaded directly with each other. However, they may be cascaded by means of an intervening current-inverting amplifier stage. For systems employing direct-coupled logic, a common-emitter PNP transistor amplifier or its equivalent is a suitable intervening current-inverting amlifier stage.

A feature of a current-mode OR gate according to the present invention is that no stand-by current is expended when all the input currents supplied thereto are in their "low" states.

Figure 3:
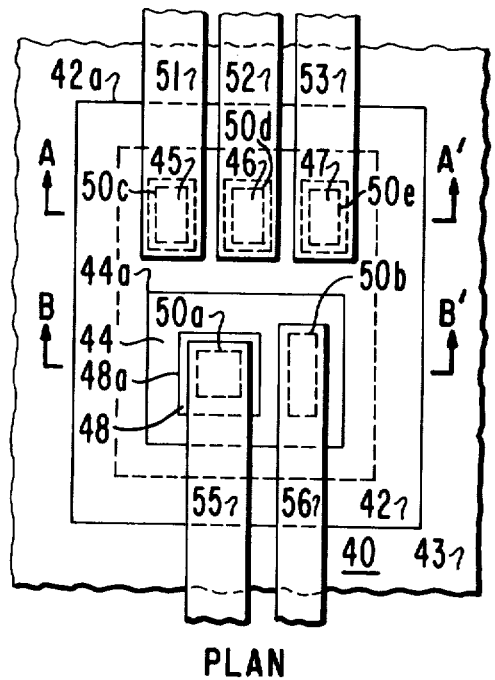
FIGS. 3, 4 and 5 are a plan view and first and second cross-sectional views, respectively, of an integrated-circuit device useful in the construction of the FIG. 2 current-mode OR gate and embodying a further aspect of the present invention.
Figure 4:
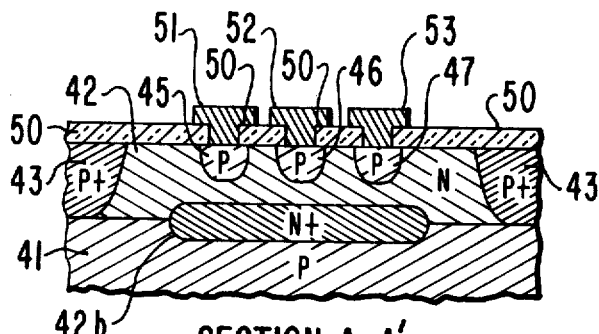
Figure 5:
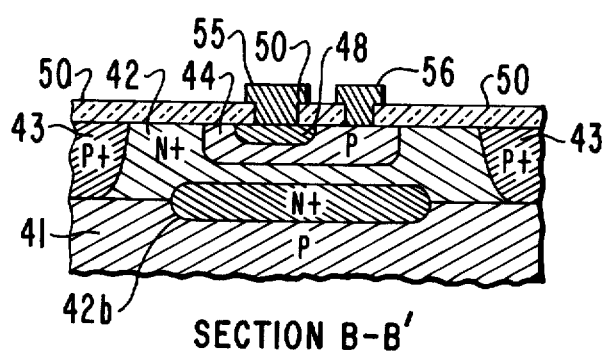

FIGS. 3, 4 and 5 are a plan and cross-sectional views of a device 40 designed for incorporation into a monolithic integrated circuit. Device 40 incorporates the transistor 5 and the steering diodes 13', 23' and 33' of the FIG. 2 circuit. In essence, the device 40 is an isolated, vertical-structure transistor differing from prior art devices in that no ohmic contact is made to its collector region. Rather, a plurality of semiconductive contacts is made to its collector region, each for providing one of the diodes 13', 23' and 33'. Otherwise, the construction of device 40 resembles that of conventional isolated, vertical-structure transistors.

More specifically, a P-type substrate 41 has an epitaxial layer 42 of N-type material thereupon. P+ diffusions 43 are used to separate this layer of N-material into isolation boats, including an isolation boat 42 having the rectangular boundary 42a. This isolation boat 42 is the collector region of the transistor 5 and may, in accordance with conventional practice, have a "pocket" or "buried layer" 42b of N+ material underlaying it. A base region 44 of P-type material is disposed in the collector region 42, as can be most clearly seen by reference to FIG. 5 showing a section B—B' taken through this base region 44. Region 44 is shown in the FIG. 3 plan view to have a rectangular boundary 44a. As can be seen from FIGS. 3 and 4, a plurality of other regions 45, 46, 47 of P-type material are also disposed in the collector region 42. These regions 45, 46 and 47 have rectangular boundaries when viewed in plan as shown in FIG. 3, which respective boundaries substantially coincide with the dotted rectangles 50c, 50d and 50e, respectively. These P regions 45, 46 and 47 can be of substantially the same depth into the collector region 42 as is the base region 44, as may be determined by comparison of sections A—A', B—B' of FIGS. 4 and 5. Accordingly, the suggested practice is to form the regions 44, 45, 46 and 47 concurrently by the same diffusion or implantation process.

An emitter region 48 of an N+ material is disposed within the base region 44, as is shown in FIGS. 3 and 4. Referring to the FIG. 3 plan view, this emitter region 48 has a square boundary 48a. The device 40 as thusfar described has a layer 50 of insulative material, typically an oxide or nitride of the basic silicon material, overlaying it completely except for certain windows. A first of these windows having a square boundary 50a is above the emitter region and permits access thereto. Other windows 50b, 50c, 50d and 50e are opened above a portion of the base region 44, and above P regions 45, 46 and 47, respectively. The boundaries of these windows are seen to best advantage in the FIG. 3 plan view.

The P regions 45, 46 and 47 are each ohmically contacted through their windows in layer 50 by metalizations 51, 52 and 53, respectively, as shown in FIG. 3. Metalization 55 makes contact with the emitter region 48 through its window, and metalization 56 makes ohmic contact with the base region 44 through its window. These metalizations are conventionally formed by the evaporation of a layer of aluminum atop the layer 50 and its windows, followed by selective etching to leave only the desired metalization for electrically connecting elements in the integrated circuit.

FIG. 6 shows a current-mode OR gate 100 as connected in a cross-point subsystem of the type it was designed to be used with, which subsystem includes four SCR cross-point switches 151, 161, 171, 181. A cross-point subsystem actually manufactured has eight SCR's used as cross-point switches.

A dashed box encompasses an array 110 of resistors 111, 121, 131, 141 corresponding in function to resistors 11, 21, 31 of the OR gates 2 and 4 of FIGS. 1 and 2. Resistors 111, 121, 131 and 141 are presumed to be fabricated as diffused resistive elements disposed in a common isolation boat. These diffused resistive elements form a semiconductor junction with their common isolation boat. Each of these junctions is a distributed element along the resistive element with which it is associated. However, the equivalent circuits of these elements can be drawn as shown with lumped-element diodes 113, 123, 133 and 143 representing the semiconductive junctions between resistors 111, 121, 131 and 141, respectively, and the isolation boat. This is because the distributed junctions will be forward-biased, if at all, only at the points along their respective resistive elements 111, 121, 131 and 141 which are most positive in potential. These points are at the ends of resistive elements 111, 121, 131, and 141 connected to the base electrodes of transistors 112, 122, 132 and 142. The common connection between the cathodes of diodes 113, 123, 133 and 143 is provided by the isolation boat itself, which is ohmically contacted and connected to the collector electrode of transistor 105.

Transistors 112, 122, 132 and 142 each form a Darlington cascade connection with transistor 106 to provide an equivalent threshold detector transistor corresponding in function to transistors 12, 22, 32 of the OR gate 2 and 4 of FIGS. 1 and 2. However, the current gain of the Darlington cascade connections is substantially equal to the product of the individual current gains of transistors 112, 122, 132 or 142 and of transistor 106, which greatly improves the sensitivity of the threshold detection function. The potential appearing across resistor 103 determines the emitter current of transistor 106 which is substantially equal to its collector current, which forms the principal portion of the output current from OR gate 100 as supplied to the base electrode of transistor 201.

More precisely, the output current which OR gate 100 supplies to the base electrode of transistor 201 comprises, in addition to the collector current of transistor 106, the combined collector currents of transistors 112, 122, 132 and 142. The combined collector currents of transistors 112, 122, 132 and 142 are substantially equal to their combined emitter currents—that is, to the base current of transistor 106. The output current provided to the base electrode of transistor 201 from OR gate 100 is then equal to the collector current of transistor 106 plus a current substantially equal to its base current. Since the emitter current of a transistor is the sum of its collector and base currents, the current supplied to the base electrode of transistor 201 by OR gate 100 is very closely equal in magnitude to the emitter current of transistor 106.

The potential across resistor 103 and hence the emitter current of transistor 106 are regulated by the shunt regulator action of transistor 105 as selectively coupled to such of the base electrodes of transistors 112, 127, 132 and 142 as are supplied "high" input currents. This selective coupling is by means of a steering network comprising "diodes" 113, 123, 133 and 143. This shunt regulation action is analogous to that described in connection with OR gate 4 of FIG. 2.

Four-layer diodes or silicon controlled-rectifiers 151, 161, 171 and 181 (hereinafter, each being referred to as SCR's) are the cross-point switching elements. The cross-point subsystem is of the type described in the paper "Monolithic IC Telephone Cross-Point Subsystem" co-authored by Adel A. Ahmed (the present inventor), Stephen C. Ahrens and Murray A. Polinsky as presented before the 1974 International Solid-State Circuits Conference and as appears on pages 120, 121, 238 of the Conference's *Digest of Technical Papers*. The subsystem is to be used in a row of an addressable matrix array of cross-point switching elements. The SCR's 151, 161, 171, 181 (which are preferably air-isolated from other elements on the integrated circuit chip) share a common anode connection to terminal 150 and thence to a row bus in the cross-point switch and are considered to be representative of the SCR's connected in a row of a cross-point system matrix. Each of these SCR's is connected in a separate column of the cross-point system matrix, in which column its cathode is connected to the cathodes of a number of other SCR's, each of which SCR's is included in the row of the system matrix. To this end, the cathodes of SCR's 151, 161, 171, and 181 have separate terminals 153, 163 173 and 183, respectively, by means of which they are connected to separate columns busses in the cross-point switch. The particular SCR cross-point switch to be addressed has a COLUMN DRIVE current generator connected to its column, and a COMMAND INPUT signal supplies gate currents to all the SCR's in the row the SCR being addressed occupies. The simultaneous provision of gate current and anode-to-cathode current to the addressed SCR causes it to become conductive and closes the cross-point switch, which remains closed thereafter despite removal of gate current until such time as the COLUMN DRIVE current is discontinued. The current-mode OR gate 100 is used to inhibit row addressing, which would otherwise take place in response to the COMMAND INPUT signal, whenever one of the SCR's 151, 161, 171 or 181 in that row is already conductive.

The sensing to detect when any one of the SCR's 151, 161, 171 or 181 has been rendered conductive, so the application of gating current to any of the others can be inhibited, is done by a means known in the art. The floating junctions of SCR's 151, 161, 171 and 181 are used to supply the base-emitter bias potentials for transistors 154, 164, 174 and 184, respectively. A conductive SCR will supply greater forward-bias to its associated transistor than a non-conductive SCR. Thus, the collector current of a transistor with base-emitter circuit biased from a conductive SCR will exceed the collector current of a transistor with base-emitter circuit biased from a non-conductive SCR. Transistors 154, 164, 174 and 184 are provided with emitter degeneration resistors 155, 165, 175 and 185, respectively, which provide current feedback to keep the loading presented by their respective base electrodes relatively light, so as not to divert appreciably large currents from the SCR's.

The problem is that for certain SCR designs which are advantageous to use, the collector flow from a transistor provided forward-biasing base-emitter potential from the floating junction of an SCR is as high as 6 microamperes when the SCR is non-conductive and is as low as 20 microamperes when the SCR is conductive. Therefore, an OR function provided by simple current summing will not suffice to distinguish reliably between 1. a condition where there are 3 or 4 transistors with relatively large "low" state currents and
2. a condition where the transistors have relatively small "low" state currents and one of the transistors provides a collector current with a relatively small "high" state.

Furthermore, the collector current of transistor 154, 164, 174 or 184 can range upward to 100 microamperes when the SCR providing forward-bias to its base-emitter junction is conductive. With simple current summing to provide the OR function this would cause an unnecessarily large "high" state output current.

The current-mode OR gate 100 is particularly well suited to determining whether or not one of the SCR's 151, 161, 171, 181 is conductive. The minimum resistance in the tolerance range of the resistance of each of the resistors 111, 121, 131, 141 is chosen so that at 20 microamperes therethrough, the potential drop thereacross well exceeds 1.65 to 1.8 volt potential needed to forward-bias the serially connected base-emitter junctions of transistor 105 and of transistor 106 and of transistor 112, 122, 132 or 142, respectively. For the normally expected ± 20% tolerance on the resistance of resistors 111, 121, 131, 141 this will mean the potential drop across each of them with 6 microamperes therethrough will be insufficient to forward bias the serially connected base-emitter junctions of transistor 105, of transistor 106 and of transistors 112, 122, 132 or 142, respectively.

The respective resistances of resistors 155, 165, 175 and 185 as respectively compared to the respective resistances of resistors 111, 121, 131 and 141 are in the same ratio. Variation of the expected "high" current caused by the absolute resistances of resistors 155, 165, 175 and 185 departing from their nominal value are compensated for by the related departure of the resistances of resistors 111, 121, 131 and 141 from their nominal value.

The resistance of resistor 103 is chosen so that at 0.6 volt potential, approximately, maintained thereacross by shunt regulatory action of transistor 105 when one of the input currents is "high", the current flow through this resistor 103 is the desired "high" value of output current to be supplied to the base electrode of transistor 201.

The output current of the current-mode OR gate 100 is applied to the equivalent "base" electrode of a composite PNP transistor comprising the cascaded PNP and NPN transistors 201 and 202. The equivalent "emitter" electrode of this PNP composite transistor is connected to the positive terminal of supply 200. Its effective "collector" electrode is connected to the input connection of a multiple-output current mirror amplifier 220. This input connection is at the base electrode of emitter-follower common-collector PNP transistor 221. Resistors 203 and 204 are high-impedance pull-down resistors to discharge the charge stored in the base-emitter junctions of transistor 201 and of transistor 202, respectively. Only when the current-mode OR gate 100 provides a "high" output current, is PNP transistor 201 biased into conduction, its collector current in turn biased NPN transistor 202 into conduction to supply any collector current withdrawn by the collector electrode of transistor 216.

The configuration 210 is a threshold switch. Transistor 216 withdraws a measured collector current whenever a COMMAND INPUT signal potential at terminal 211 applied via resistor 212 to junction diode 213 and the base-emitter junction of transistor 214 is sufficiently positive to forward-bias both junctions. In response to its base-emitter junction being sufficiently forward-biased, transistor 214 saturates. During saturation, the positive collector potential of transistor 214 is brought within 0.1–0.2 volts of ground, and the impedance offered at the base electrode of the transistor is lowered, since transistor current gain is much lowered by saturation. The low base impedance of transistor 214, and the forward conduction of diode 213 brought about by base current flow to transistor 214, clamp the base electrode of transistor 216 at a clamp voltage substantially twice the forward-biased junction potential. The raising of the base potential of transistor 216 to the clamp voltage and the pulling down of the potential at the other end of its emitter degeneration resistor by the saturation of transistor 214 forward biases the base-emitter junction of transistor 216. Since the base electrode of transistor 216 is clamped to twice the forward-biased junction potential, its emitter electrode will, by emitter-follower action, be at forward-biased junction potential (about 0.6 volts). The potentials at the ends of resistor 215 are therefore determined, its resistance is of fixed known value and so the emitter current which transistor 216 must supply to support this potential drop is determined in accordance with Ohm's Law. Transistor 216 has a common-base current gain of nearly unit so its collector current is substantially equal to its emitter current.

If transistor 216 withdraws collector current in response to a COMMAND INPUT signal applied to terminal 211 and if transistor 202 is non-conductive and therefore does not provide a low-impedance path for providing this collector current, the multiple-output current mirror amplifier 220 is biased into conduction. More particularly, a portion of the collector current of transistor 216 is withdrawn as base current from transistor 221, and amplified by the common-collector amplifier action of transistor 221 to supply an emitter current. This emitter current develops a potential drop across the pull-up resistor 222 and the base-emitter junctions of transistors 223, 225, 226, 227, 228, which drop biases transistor 223 into conduction. The collector-to-base degenerative feedback provided to transistor 223 by the emitter-follower action of transistor 221 regulates the potential across its base-emitter junction to be just sufficient to cause its collector to supply the collector demand of transistor 216 (except for a negligible portion by the base- current of transistor 221) whenever this demand is not supplied from the emitter of transistor 202.

The regulated base-emitter potential of transistor 223 is applied to the base-emitter junctions of transistors 225, 226, 227 and 228 to cause them to provide collector currents each proportional to the collector current of transistor 223. The transistors 223, 225, 226, 227 and 228 may be provided with emitter degeneration resistors to improve the accuracy and reliability of the proportions between their collector currents.

The collector current flows of transistors 225, 226, 227 and 228 in response to:
1. a COMMAND INPUT signal applied to terminal 211 causing transistor 216 to conduct and
2. to the OR gate 100 no inhibiting input current from being drawn from the multiple-output current mirror amplifier 220 are applied to the base electrodes of transistors 235, 236, 237 and 238, respectively, for amplification. The resulting emitter currents from transistors 235, 236, 237 and 238 are applied through diodes 245, 246, 247 and 248, respectively, to terminals 152, 162, 172 and 182, respectively. So, when the COMMAND INPUT signal is applied to terminal 211, gate current is furnished to each of the SCR's 151, 161, 171, 181. Whichever one of these SCR's has its cathode electrode connected to a path ending in a COLUMN DRIVE current generator will be biased into conduction, and after the COMMAND INPUT signal is no longer applied to terminal 211 the selected SCR will remain conductive.

Diodes 245, 246, 247 and 248 are preferably formed by lateral transistors, each having interconnected collector and base electrodes to serve as anode to the cathode provided by its emitter electrode. These diodes inhibit application of gate current to ones of the SCR's 151, 161, 171 and 181 which are in columns already having a conducting SCR in them. All the SCR's 151, 161, 171, 181 have their anodes connected to a potential more positive than the positive operating potential provided by supply 200. The gate electrodes of the ones of SCR's 151, 161, 171 and 181 which are conductive or which are connected in a column having a conductive SCR therein also exhibit a potential more positive than the potential afforded by supply 200. Each of diodes 245, 246, 247 and 248 connected to a gate electrode exhibiting these more positive potentials will be reverse-biased and so will not conduct current in that gate electrode.

The ones of diodes 245, 246, 247 and 248 which do not conduct current to an SCR gate electrode cause the ones of their associated NPN transistors 235, 236, 237 and 238 to be non-conductive. This, in turn, causes the ones of the PNP transistors 225, 226, 227 and 228 which are not called upon to supply base current to one of the NPN transistors 235, 236, 237 and 238 to saturate. When any one of the PNP transistors 225, 226, 227 and 228 saturates, a parasitic transistor to substrate is formed which has sufficient current gain that the impedance at the base electrode of the PNP transistors is not unduly lowered. There is, accordingly, no adverse upon the current mirror amplifier relationship of transistor 223 and whichever of the transistors 225, 226, 227 and 228 is not saturated.

FIGS. 7, 8 and 9 show a plan view and a first and a second cross-sectional views of a portion of a monolithic semiconductor integrated circuit comprising the resistor-diode array 110 and transistor 105. Transistor 105 is of conventional construction and resembles the transistor described in connection with FIGS. 3, 4 and 5 except for the fact there are no P regions 45, 46 and 47, disposed in the N-type collector region 42' having rectangular boundary 42'a in the FIG. 7 plan view. Windows in layer 50 for providing access to these P regions are omitted. Instead an N+ is disposed in collector region 42', and a window in layer 50 as defined by boundary 50f is provided above region 42c so that metalization 57 can be ohmically contacted thereto.

Resistors 111, 121, 131, 141 are formed by P regions 61, 62, 63, 64 which are disposed in an isolation boat 42". Isolation boat 42" is defined by rectangular boundary 42"a in the FIG. 7 plan view. An N+ region is disposed in isolation boat 42" under the window defined by boundary 50g and is ohmically contacted by metalization 57. Each of the P regions 61, 62, 63, 64 has a pair of windows, one at one of its extremities through which ohmic contact to ground metalization 55 is made and the other at the other of its extremities. P regions 61, 62, 63 and 64 are ohmically contacted through this latter set of windows by metalizations 51, 52, 53 and 54, respectively. An N+ region 65 may, as depicted in FIGS. 7 and 8, be disposed so as to narrow the cross-sections of the P regions 61, 62, 63, 64 perpendicular to the axis between their contacted extremities and thereby raise their resistance between those extremities. Whether this "pinch resistor" fabrication option is pursued or not does not appreciably affect the positioning of the forward-biased portions of "diodes" 113, 123, 133 and 143 which are under the relatively high potential portions of P regions 61, 62, 63 and 64, respectively, located where ohmic contact is made to metalizations 51, 52, 53 and 54, respectively.

FIG. 10 illustrates in plan view how transistor 105 and array 10 can be disposed in a single isolation boat 42''' of N-type material, which doubles as collector region for transistor 105 and as the common cathode of "diodes" 113', 123, 133' and 143'. Similarly, to the FIG. 3 device, no collector electrode need be brought out of the region 42". In some instances, a "latch up" condition may obtain in the FIG. 10 device because of lateral transistor action between the transistor base region 44 and the P regions 61, 62, 63 and 64 of resistors 111, 121, 131 and 141. The occurence of this undesirable condition depends upon the details of the particular processing used to make the devices, particularly the crystal axis of the silicon used, and the proximity of the base regions 44 to the P regions 61, 62, 63, 64. A very effective step which can cure the condition, should it occur, is not only to space region 44 somewhat further from the P regions 61, 62, 63, 64 used as resistors but also to include P+ or N+ diffusions in the portion of the N isolation boat between base region 44 and regions 61, 62, 63, 64. Sections B—B' and C—C' through the FIG. 10 device are shown in FIGS. 5 and 8, respectively.

With respect to the FIGS. 7 and 10 plan views it will be understood by those skilled in the art that the relative positioning of the P regions 61, 62, 63 and 64 and of the transistor having its collector region coupled to their isolation boat or boats may vary considerably from the specific relative positions shown.

The current-mode OR gates shown in FIGS. 1, 2 and 6 and particularly described in this specification have employed bipolar transistors, and the claims are couched in terms commonly associated with that type of transistor. However, the general configurations are applicable for use with field effect transistors since it is the transconductance rather than the current gain characteristics of the transistors which are important in the type of current logic described herein. The term "transistor" in the claims embraces field effect as well as bipolar transistors, except when details of physical structure are to the contrary. The terms "base", "emitter" and "collector" as used in the claims include within their scope the terms "gate", "source" and "drain", respectively, commonly associated with field effect transistors, except where details of physical structure are to the contrary.

What is claimed is:

1. A current-mode OR gate comprising, in combination:
    an output terminal and a common terminal for connection to an output circuit;
    a plurality of switches, each having a conduction path and a control electrode for controlling the conductivity of its conduction path, said conduction paths connected in parallel between said output terminal and a third terminal, said control electrodes serving as input terminals;
    means direct current conductively coupling said third terminal to said common terminal;
    means responsive to an input current of greater than a given value applied to one of said input terminals for causing the path of the switch connected to that input terminal to be conductive; and
    regulator means connected for sensing the current flow through said direct current conductive coupling means and responsive to said current exceeding a given fixed value for establishing between each separate one of said input terminals and said common terminal a shunt path for diverting that portion of the signal current applied to its input terminal which would tend to cause the current through said direct current conductive current conductive coupling means to exceed further said given value.

2. A current-mode OR gate as set forth in claim 1 wherein said means responsive to an input current comprises resistive means connected between that input terminal and said common terminal for developing a voltage in response to said input current.

3. A current-mode OR gate comprising, in combination:
    an output terminal and a common terminal for connection to an output circuit;
    a plurality of switches, each having a conduction path and a control electrode for controlling the conductivity of its path, said conduction paths connected in parallel between said output terminal and a third terminal, said control electrodes serving as input terminals;
    direct current impedance means connected between said third terminal and said common terminal;
    means responsive to an input current of greater than a given value applied to one of said input terminals for closing the switch connected to that input terminal; and
    regulator means connected for sensing the potential across said direct current impedance means and responsive to said voltage when it exceeds a given fixed value for establishing between each separate one of said input terminals and said common terminal a shunt path for diverting that portion of the signal current applied to its input terminal which would tend to cause the voltage across said direct current impedance means to exceed further said given value.

4. A current-mode OR gate as set forth in claim 3 wherein said regulator means comprises:
    a plurality of transistors having their respective collector electrodes each connected to a separate one of said input terminals, having their respective base electrodes each connected to said third terminal and having their respective emitter electrodes connected to said common terminal, their respective collector-to-emitter paths being included within a respective one of said shunt paths.

5. A current-mode OR gate as set forth in claim 3 wherein said regulator means comprises:
    a transistor having a base electrode connected to said third terminal, having a collector and an emitter electrodes and a collector-to-emitter path therebetween, and having its said emitter electrode connected to said common terminal; and
    a plurality of diodes each having a similar one of its anode and cathode electrodes connected to a separate respective one of said input terminals and the other connected to said transistor collector electrode, each said diode together with said collector-to-emitter path of said transistor comprising a respective one of said shunt paths.

6. A current-mode OR gate as set forth in claim 3 wherein each of said plurality of switches comprises:
    a transistor having a base electrode connected to a respective one of said input terminals, having a collector electrode connected to said output terminal and having an emitter electrode connected to said third terminal.

7. A current-mode OR gate as set forth in claim 3 wherein said plurality of switches together comprise:
    a plurality of transistors, each having a base electrode connected to a respective separate one of said input terminals, and each having a collector electrode and an emitter electrode;
    means connected to the collector electrode of each of said plurality of transistors to provide an operating potential thereto; and
    a further transistor having a base electrode to which each of the base electrodes of said plurality of transistors is connected, having a collector electrode connected to said output terminal, and having an emitter electrode connected to said third terminal.

8. A current mode OR gate as set forth in claim 3 wherein said plurality of switches together comprise:
- a plurality of transistors, each having a base electrode connected to a respective separate one of said input terminals, each having a collector electrode connected to said output terminal and each having an emitter electrode, and
- a further transistor having a base electrode to which each of the base electrodes of said plurality of transistors is connected, having a collector electrode connected to said output terminal and having an emitter electrode connected to said third terminal.

9. A current mode OR gate comprising:
- a plurality of input terminals, a common terminal and an output terminal;
- a plurality of threshold detection circuits, each having a controllably-conductive path connected between said output terminal and a first point of interconnection, each having a control terminal connected to a respective separate one of said input terminals, and each characterized by its controllably-conductive path being substantially non-conductive until the current applied to its control terminal is in excess of a threshold value and conductive in a degree dependent upon the degree of said excess thereafter;
- direct current conductive means connecting said first point of interconnection to said common terminal;
- regulator means for sensing the current flowing through said direct current conductive means and when it tends to exceed a predetermined value, for providing a shunt current path connected at one end to said common terminal and having a second end; and
- steering means connected between each input terminal and the second end of said shunt current path for diverting to said shunt current path that portion of the input current applied to any input terminal, which would tend to cause the current flow through said conductive means to increase to a value greater than said predetermined value.

10. A current mode OR gate as set forth in claim 9 wherein said threshold detection circuits each include:
- a transistor having a base electrode connected to its said control terminal, having an emitter electrode and a collector electrode;
- means connecting said transistor collector electrode to receive collector biasing potential; and
- a resistive element connecting said transistor base electrode to said common terminal, wherein the potential drop which must be developed across said resistive element in response to input current supplied to said threshold detection circuit in order to achieve the potential across the base-emitter junction of said transistor to initiate substantial current flow therethrough determines at least in part said threshold value, and wherein said current-mode OR gate has
- means for direct coupling each of the emitter electrodes of said transistors in said respective threshold detection circuits to said first point of interconnection.

11. A current-mode OR gate as set forth in claim 10, wherein said means for direct coupling each of the emitter electrodes of said transistors in said respective threshold detection circuits to said first point of interconnection comprises;
- a further transistor having a base electrode to which the emitter electrode of each of the aforesaid transistors is connected, having an emitter electrode connected to said first point of interconnection, and having a collector electrode connected to said output terminal.

12. A current-mode OR gate as set forth in claim 10 constructed within a monolithic semiconductor integrated circuit characterized by a device comprising within itself said resistive elements, at least a portion of said regulator means, and said steering means, said device having the following features:
- an isolation boat of semiconductive material with a first type of doping, being identifiable as the collector region of a transistor in said regulator means;
- a plurality of regions of semiconductive material with a second type of doping, each disposed within said isolation boat and forming a semiconductor junction therewith, one of said first and said second types of doping being N-type and the other P-type;
- means for making an ohmic contact with the first of said plurality of regions, which regions is identifiable as the base region of said transistor in said regulator means;
- means direct coupling said first point of interconnection to said ohmic contact to said base region;
- a region of semiconductive material with said first type of doping being identifiable as the emitter region of said transistor in said regulator means, being disposed in said first region of semiconductor material with said second type of doping and forming a semiconductor junction therewith;
- means for making ohmic contact with said region of semiconductive material with said first type of doping;
- means electrically connecting said common terminal to said ohmic contact to said emitter region;
- means making a first and a second ohmic contacts with each of said plurality of regions of semiconductive material with said second type of doping other than the first hereinafter referred to as said further regions these said first and said second ohmic contacts being respectively at a first situs and at a second situs removed therefrom, thereby to provide a resistive element between the first and the second ohmic contacts of said further regions;
- means electrically connecting each of the first ohmic contacts of said further regions to respective separate ones of said input terminals; and
- means electrically connecting each of the second ohmic contacts of said further regions to said common terminal.

13. A current-mode OR gate as set forth in claim 9 wherein said steering means comprises:
- a plurality of diodes each having a first electrode connected to a respective separate one of said input terminals and each having a second electrode connected to said second end of said shunt path.

14. A current-mode OR gate as set forth in claim 13 wherein said regulator means comprises a transistor having a base electrode directly coupled to said first point of interconnection, an emitter electrode connected to said common terminal and a collector electrode serving as the second end of said current path.

15. A current-mode OR gate as set forth in claim 14 wherein said direct current conductive means comprises a resistive element connected between said first point of interconnection and said common terminal.

16. A current-mode OR gate as set forth in claim 13 constructed within a monolithic semiconductor integrated circuit characterized by a device comprising within itself said plurality of diodes and said resistive elements, said device having the following features:
- an isolation boat of semiconductive material with a first type of doping;
- means making an ohmic contact with said isolation boat, which ohmic contact is connected to the collector electrode of said transistor in said regulator means;
- a plurality of regions of semiconductive material with a second type of doping, one of said first and second types of doping being N-type and the other P-type, each disposed within said isolation boat and forming a semiconductor junction therewith a portion of which provides one of said plurality of diodes;
- means making first and second ohmic contacts with each of said plurality of regions of semiconductive material with a second type of doping, said first and said second ohmic contacts to each of the regions being made respectively at a first situs and at a second situs removed therefrom, thereby to provide a resistive element between the first and the second ohmic contacts of each of these regions;
- means electrically connecting each of the first ohmic contacts of said plurality of regions to a respective separate one of said input terminals; and
- means electrically connecting each of the second ohmic contacts of said plurality of regions to said common terminal.

17. A current-mode OR gate as set forth in claim 16 wherein said characteristics device has:
- a region of semiconductive material with a region of said first doping, overlaying a portion of at least one of said regions of semiconductive material with said second type of doping, between said first situs and said second situs thereof, whereby the resistive element provided by that region of semiconductive material with said second type of doping is a pinch-resistance element.

18. A current-mode OR gate as set forth in claim 9 constructed within a monolithic semiconductor integrated circuit, characterized by a device comprising within itself at least a portion of both said regulator means and said steering means, said device having the following features:
- an isolation boat of semiconductive material with a first type of doping, being identifiable as the collector region of a transistor in said regulator means;
- a plurality of regions of semiconductive material with a second type of doping, each disposed within said isolation boat and forming a semiconductive junction therewith, and each being provided with an ohmic contact, one of these regions being identifiable as the base region of said transistor in said regulator means and its ohmic contact being electrically connected to said first point of interconnection and the ohmic contacts of the others each being electrically conected to a respective separate one of said input terminals, one of said first and second types of doping being P-type and the other N-type;
- a region of semiconductive material with said first type of doping being identifiable as the emitter region of said transistor in said regulator means, being disposed within said first region of semiconductive material with said second type of doping, and forming a semiconductive junction therewith;
- means for providing an ohmic contact to said emitter region; and
- direct current conductive means connecting said ohmic contact of said emitter region to said common terminal.

19. In combination with a current-mode OR gate as set forth in claim 9:
- a ROW terminal and a plurality of COLUMN terminals;
- a plurality of semiconductor controlled rectifiers having four layers or regions respectively contacted by an anode, a cathode, a gate electrode and a floating region electrode; the same one of said anode and said cathode being connected to said ROW terminal for each of said controlled rectifiers and the other of said anode and said cathode being connected to a separate one of said COLUMN terminals; and
- a plurality of transistors each having an emitter electrode connected to said ROW terminal each having a base electrode connected to a respective separate one of said other electrodes of said controlled rectifiers, each having a collector electrode connected to a respective separate one of said current-mode OR gate input terminals.

20. A telephone crosspoint subsystem including the combination of claim 19 with each of said controlled rectifiers providing a cross-point switching element between its anode and its cathode and further comprising:
- means for selectably supplying gate current to a selected one of said controlled rectifier gate electrodes; and
- means for inhibiting said supplying of gate current in response to the output current of said current-mode OR gate substantially attaining said predetermined value thereof.

21. A telephone cross-point system including the combination of claim 19, with each of said controlled rectifier providing a cross-point switching element between its anode and its cathode and further comprising:
- a current amplifier having an input terminal and a plurality of output terminals;
- a plurality of diodes each connecting a respective separate one of said current amplifier output terminals to a respective separate one of said controlled rectifier gate electrodes;
- a COMMAND INPUT terminal;
- a threshold switch having an input circuit connected to said COMMAND INPUT terminal and having an output circuit for responding to a signal received at said COMMAND INPUT terminal to provide output current of amplitude limited to less than said predetermined value; and
- means for counteractively combining the output currents of said threshold switch and said current-mode OR gate and providing the result to said current amplifier input terminal.

* * * * *